United States Patent [19]

Gerig

[11] 4,329,571
[45] May 11, 1982

[54] COUNTING WITH PLURAL ELECTRIC FIELDS

[76] Inventor: John S. Gerig, 1916 Isaac Newton Sq. West, Reston, Va. 22090

[21] Appl. No.: 30,800

[22] Filed: Apr. 17, 1979

[51] Int. Cl.³ ............................................. G06M 9/00
[52] U.S. Cl. .............................. 235/92 PK; 340/561
[58] Field of Search .......... 235/92 PK, 92 SB, 92 PS, 235/92 QC, 98 A; 324/61R; 340/561, 568, 673, 674

[56] References Cited

U.S. PATENT DOCUMENTS

| | | | |
|---|---|---|---|
| 2,708,746 | 5/1955 | Shaw | 235/92 PK |
| 3,020,473 | 2/1962 | Cauley | 235/92 PK |
| 3,223,319 | 12/1965 | Lucich et al. | 235/92 PK |
| 3,384,887 | 5/1965 | Trimble | 340/561 |
| 3,439,358 | 4/1969 | Salmons | 235/92 PK |
| 3,881,353 | 5/1975 | Fathauer | 235/92 PK |
| 3,944,792 | 3/1976 | Sautner | 235/92 PK |
| 3,964,041 | 6/1976 | Hinds | 235/92 PK |
| 4,071,820 | 1/1978 | Mushinsky | 324/61 R |
| 4,112,419 | 9/1978 | Kinoshita et al. | 340/560 |

Primary Examiner—Joseph M. Thesz
Attorney, Agent, or Firm—James C. Wray

[57] ABSTRACT

Integrated circuits contained in a rail are passed through cylindrical electrodes. Two electrodes are connected to an oscillator to transmit out of phase fields. A receiving electrode's output has the residual oscillator frequency component removed by a nulling network and summation device, whose output is fed to a band pass amplifier and balanced demodulator, which receives a phase shifted input from the oscillator. Demodulator output components at and above the oscillator frequency are removed by a low pass filter. A demodulator output above the reference voltage triggers a counter.

7 Claims, 3 Drawing Figures

COUNTING WITH PLURAL ELECTRIC FIELDS

BACKGROUND OF THE INVENTION

This invention relates generally to a means of rapidly and accurately counting large quantities of objects, and more specifically to counting dual-in-line plastic (DIP) integrated circuits (IC's), packaged, as is customary in the semiconductor industry, in extruded plastic cylinders sometimes called "rails".

An increasingly large fraction of the total product of the semiconductor industry consists of linear and digital integrated circuits. The volume of production and the aggregate economic value of these integrated circuits gives rise to a need for improved methods of counting in order to facilitate inventory control in their manufacture and distribution.

Many of the conventional counting methods are of limited usefulness in the case of IC's packaged in rails. Methods based on weight are handicapped by the substantial and uncertain weight of the rail itself. Labels or other markings on the rail itself, and the lack of an optically conspicuous line of demarkation between contiguous IC's, lead to difficulty in the case of optical counting methods. Magnetic methods are unduly sensitive to variations from type to type in the magnetic properties of IC's and, indeed, some IC's are virtually nonmagnetic.

Possible methods based on electrical capacity typically require that the IC being counted be well separated (singulated) from its neighbors. Also, capacity measuring techniques operating at lower carrier frequencies are adversely affected by the antistatic coating used on rails for IC's.

SUMMARY OF THE INVENTION

The invention described herein overcomes these and other limitations of methods previously considered. In considering the invention it must be understood that each of the multiple leads of a DIP packaged IC is connected electrically to the silicon die which is the IC proper, and that each lead sees an electrical admittance to the substrate of the die equivalent to a few picofarads of capacity in parallel with a more-or-less complex network of semiconductor diodes and transistors. At all but the highest radio frequencies, this admittance is large compared to that corresponding to the capacity of any single lead to a remote ground plane. Accordingly, the leads of an IC can be considered short circuited together insofar as an external electrostatic field is concerned. Thus, each IC can be modeled as an isopotential surface whose voltage is independent of that of neighboring IC's in the rail.

In a preferred embodiment of the invention one or more transmitting electrodes establish a field so that the voltage induced by mutual capacity on a nearby IC varies in a desired manner as the IC moves. Voltage on a particular IC is coupled by mutual capacity to one or more receiving electrodes in a reliable manner as IC's pass, one after the other, through a channel containing the electrodes. The variation is relatively independent of the closeness of spacing of the IC's, so that both isolated and closely packed IC's are counted.

The resulting signal is amplified and applied to a balanced demodulator where it is multiplied with a reference obtained from the oscillator. The demodulator output corresponds to mutual capacity components in the signal picked up by the receiving electrodes.

The output is applied to a voltage comparator where it is compared with reference voltage. The voltage waveform at the output alternates from negative to positive values, reaching a positive maximum as each IC passes in turn through a certain reference plane in the electrode structure. The comparator output switches one for each IC passing through the electrodes. Any of a variety of means can then be used to total and display or otherwise use the count of IC's.

The present invention provides fast, error-free counts of the number of integrated circuits packaged in standard plastic carriers. The unique RF capacity bridge technique used in the counter is unaffected by paper or plastic labels, plastic plugs, rivets or anti-static treatment of the containers.

The counter is intended for use in shipping and receiving departments handling high volumes of dual-in-line integrated circuits. To obtain a count of the IC's in one or more carriers, the operator clears the LED display to zero and passes the carriers, one at a time, but as rapidly as desired, through the appropriate aperture in a sensing head. The total number of IC's counted appears on the LED display of a commercially available counter.

Power and display reset controls are located on the display unit, which is connected by a coaxial cable to the sensing head.

Preferably a smaller counting aperture has a diameter of 0.750 inches and counts 14 through 24 pin dual-in-line IC's having a 0.300" pin spacing. The larger aperture has a one inch diameter and counts 24 through 40 pin IC's having a 0.600" pin spacing. RF signal levels occurring in the sensing head are negligibly low.

A commercial printer output and an IEEE-488 computor interface may be used for the counter.

Integrated circuits mounted on a rail are passed through cylindrical electrodes. Two electrodes are connected to an oscillator to transmit out of phase fields. A receiving electrode's output has the oscillator frequency removed by a nulling network and summation device, whose output is fed to a band pass amplifier and balanced demodulator, which receives a phase shifted input from the oscillator. Frequencies at and above the oscillator frequency are removed by a low pass filter. Signals above the reference voltage are passed to a counter.

An object of the invention is the provision of apparatus for counting IC's having a field producing means, field influence detecting means, means to confine articles to be counted within a field near the producing and detecting means, means for producing a count signal upon detected field influences.

Another object of the invention is the provision of counting apparatus having signal producing means transmitting means connected to the signal producing means for creating a field, receiving means for sensing the field and producing a signal, demodulator means connected to the signal producing means and to the receiving means for comparing the signals, and output means connected to the demodulator means for producing an output count, a signal from the demodulator means.

Another object of the invention is the provision of a method of counting IC's comprising creating a field, passing articles into and out of the field and changing the field thereby, detecting field changes and producing a count signal upon detecting the field changes.

A further object of the invention is the provision of a method of counting IC's which first produces a signal, transmits a field according to the signal, senses field changes and produces a second signal according to articles passing through the field, demodulates one of the first and second signals according to the other of the first and second signals and produces a third signal according to the demodulating, compares the third signal with a reference signal and produces a count signal when the third signal differs in a predetermined manner from a reference signal.

An object of the invention is the provision of a method of counting by producing an electro field, passing articles through the field, altering patterns of the field with articles in the field, sensing the altered patterns, and counting the altered patterns.

A further object is the provision of the method as described wherein the patterns alter according to distinct isopotentials of the articles.

One object of the invention is the provision of the method as described which includes passing articles each having multiple circuits with diverse electronic elements and multiple spaced connectors through the field and altering the field with an isopotential influence of all of the connectors, circuits and elements in each article.

An object of the invention is the provision of integrated circuit counting apparatus having plural electrodes, at least one of which is connected to a field creating means, at least one other electrode connected to a field receiving means, and signal producing means connected to the field creating means and field receiving means for producing a signal which indicates passing of an integrated circuit near the field transmitting means and field receiving means.

Another object of the invention is the provision of the apparatus as described wherein the field creating means includes an oscillator, a transmitting feed matrix connected to the oscillator, and first and second transmitting electrodes connected to the transmitting feed matrix for out of phase excitation of the first and second transmitting electrodes, a phase shifter connected to the oscillator and a demodulator connected to the phase shifter, an adjustable nulling network connected to the oscillator summation means having inputs connected to the field receiving means and to the nulling network, a band pass amplifier connected to the summation means and having an output connected to the demodulator, a low pass filter connected to the demodulator, and a comparator having an input connected to the low pass filter and having a second input connected to a source of reference voltage, the comparator having an output for connection to a counter.

These and further objects and features of the invention are apparent in the disclosure which includes the above and ongoing specification and claims and drawings.

DETAILED DESCRIPTION OF A PREFERRED EMBODIMENT

Figures 1, 2:
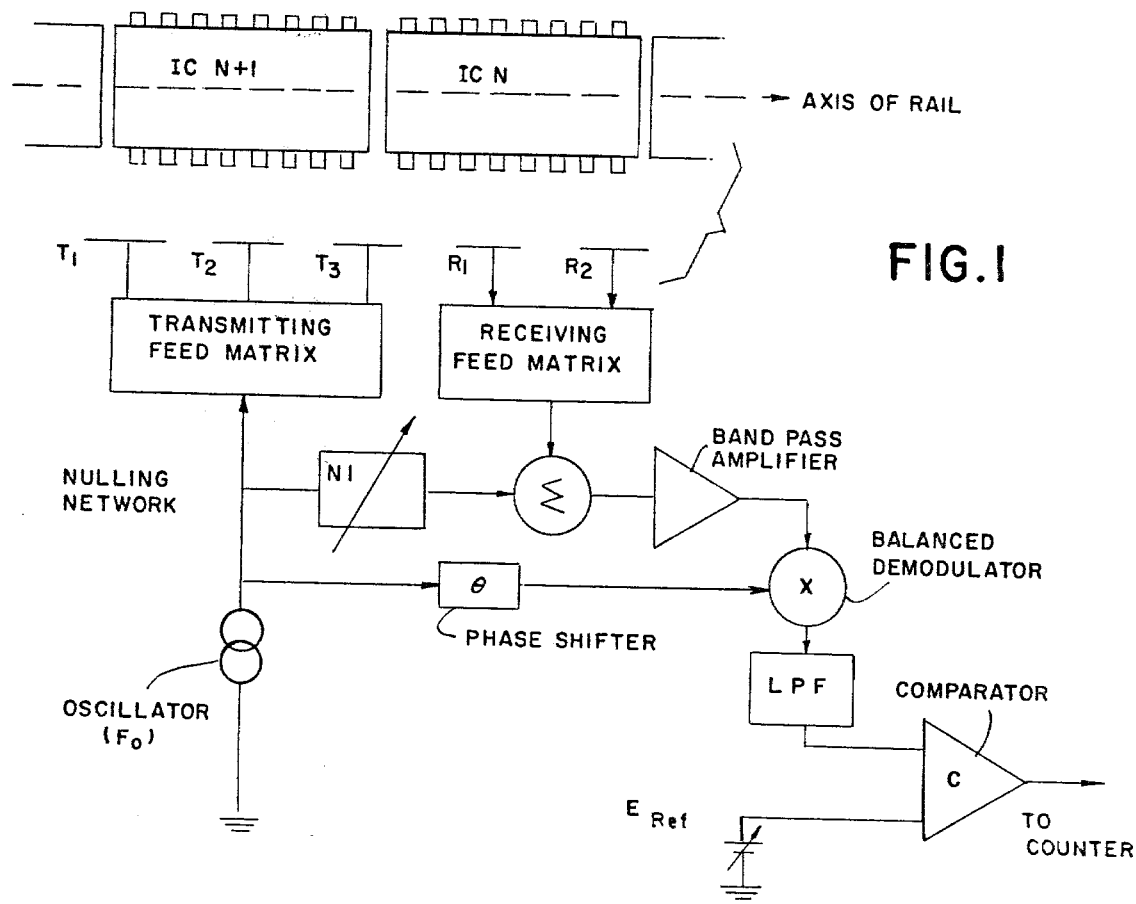
FIG. 1 is a schematic representation of the counting apparatus and method.
FIG. 2 is a schematic representation of electrodes.

FIG. 1 is a block diagram of one embodiment of the present invention. In considering FIG. 1, it must be understood that each of the multiple leads of a DIP packaged IC is connected electrically to the silicon die which is the IC proper, and that each lead sees an electrical admittance to the substrate of the die equivalent to a few picofarads of capacity in parallel with a more-or-less complete network of semiconductor diodes and transistors. This admittance is, at all but the highest radio frequencies, large compared to that corresponding to the capacity of any single lead to a remote ground plane. Accordingly, the leads of an IC can be considered short circuited together insofar as an external electrostatic field is concerned. Thus, each IC can be modeled as isopotential surface whose voltage is independent of that of neighboring IC's in the rail.

In the block diagram of FIG. 1 one or more transmitting electrodes (T1, T2, and T3) are driven via a transmitting feed matrix from a signal source at a frequency $F_o$. The feed matrix establishes the amplitudes and phases of the voltages on the transmitting electrodes so that the voltage induced by mutual capacity on a nearby IC varies in a desired manner as the IC, within the rail, moves with the rail along its axis. The voltage on the particular IC is also coupled by mutual capacity to a system of one or more receiving electrodes (R1 and R2) whose outputs are weighted together in a receiving feed matrix. By suitably choosing the weighting factors in the transmitting and receiving matrix, with due regard to the geometry of the electrodes and the geometries of the various sizes of chips to be counted, a phasor representing the electrical output of the receive matrix due to overall mutual capacity between the transmitting and receiving electrodes can be made to vary in a predictable and reliable manner as IC's pass, one after the other, through a channel containing the electrodes. In particular, the variation can be made relatively independent of the closeness of spacing of the IC's, so that both isolated and closely packed IC's can be counted.

An adjustable nulling network N1 whose output is added to the output of the receiving matrix allows the phasor to be shifted parallel to itself, and in particular allows any residual mutual capacity between transmitting and receiving electrodes to be nulled out.

The resulting signal is amplified and applied to a balanced demodulator (sometimes referred to as a phase-selective or coherent demodulator) where it is in effect multiplied with a reference obtained from the oscillator whose phase can be suitably adjusted. The demodulator output, passed through a lowpass filter to remove frequency components at and above $F_o$, is proportional to the projection of the phasor against a reference phasor whose angle is determined by the phase shifter. By suitably adjusting the phase shifter, the lowpass filter output can be made to correspond to mutual capacity components in the signal picked up by the receiving electrode, and to be orthogonal to mutual resistance components such as may be produced by partially conductive antistatic coatings on the rail.

The lowpass filter output is applied to a voltage comparator where it is compared with an adjustable reference voltage. When the phase shifter is suitably adjusted, the voltage waveform at the filter output will alternate from negative to positive values, reaching a positive maximum as each IC passes in turn through a certain reference plane in the electrode structure. By setting the voltage reference input to the comparator to somewhat below this positive maximum, the comparator output can by made to switch once for each IC passing through the electrodes. Any of a variety of means can then be used to total and display or otherwise use the count of IC's.

The best choice of electrode number and geometry depends on such factors as the variety of IC's sizes to be accommodated and the degree to which the relative position of the IC's and the electrode can be constrained.

Use of just one electrode for the transmitter and one for the receiver has been found satisfactory in applications where the IC's are well separated. This version proves unreliable in the case of closely-spaced IC's, however, due to the substantial mutual capacity between the IC's. In the latter case, a design using two transmitting electrodes excited out-of-phase together, with a single receiving electrode, has been found satisfactory when used in combination with circular cylindrical electrodes as shown in FIG. 2. The circular geometry of the electrodes has the added advantage that the coupled signal is necessarily invariant to rotation of the rail about its longitudinal axis.

It should be understood that, since the system consisting of transmitting and receiving electrodes together with the associated feed matrixes is a linear reciprocal electrical network, identical results will be obtained if the roles of the transmitting and receiving electrodes are interchanged.

Figure 3:
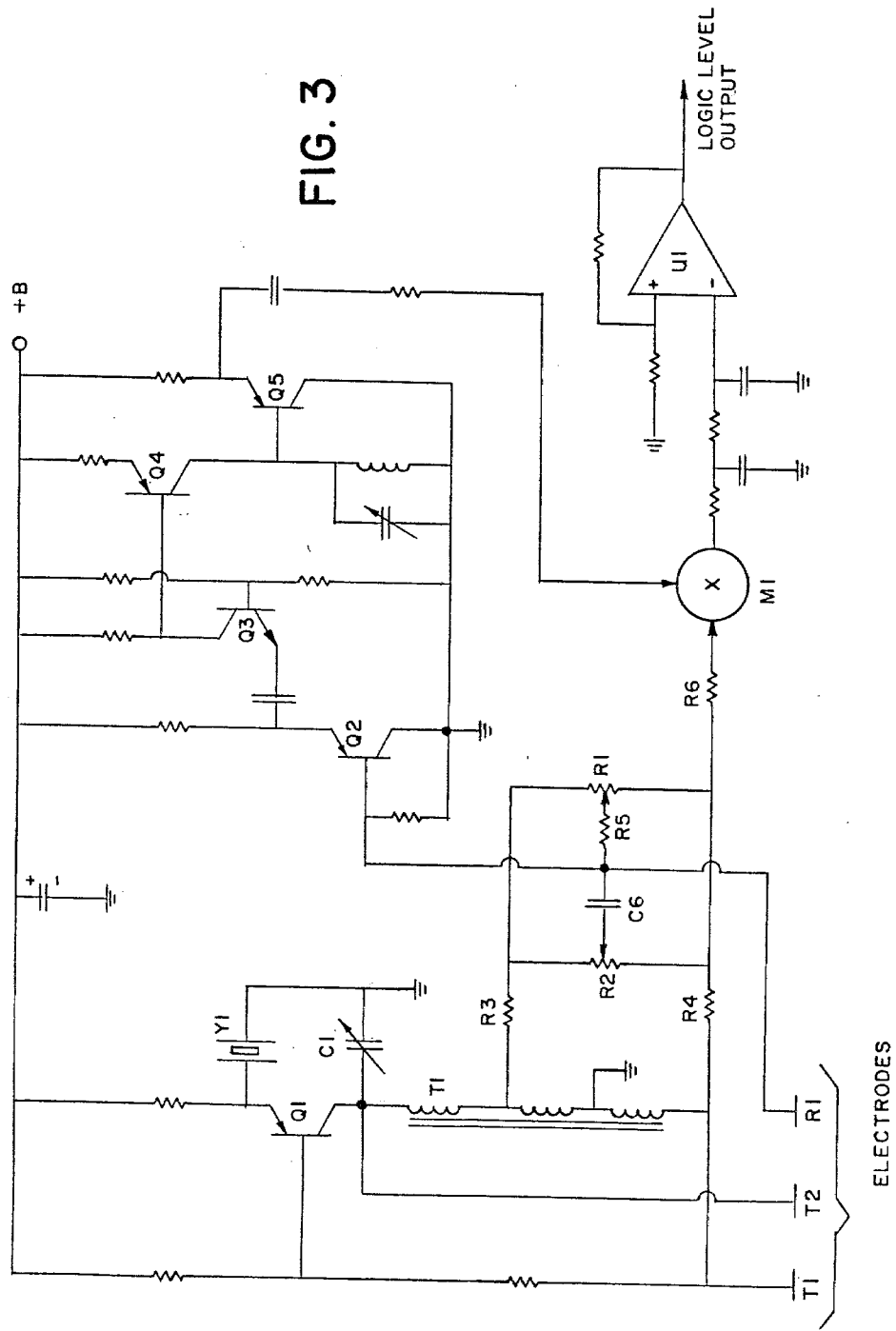
FIG. 3 is a schematic diagram of one apparatus for carrying out the invention.

FIG. 3 shows a specific schematic used in combination with the electrode system of FIG. 2. Transistor Q1 is a low level oscillator whose frequency is fixed at 9 MHz by crystal Y1. Transformer T1, tuned to 9 MHz by C1, provides out-of-phase excitation to the transmitting electrodes with a voltage ratio of 8:1. Potentiometers R1 and R2 allow independent control of the in-phase and quadrature component outputs of a nulling network including R3, R4, R5 and C6.

Transistors Q2 through Q5 provide approximately 60 dB of voltage gain at 9 MHz. The output of emitter-follower Q5 drives a diode quad balanced demodulator M1 whose reference input is obtained via R6 from the Q1 oscillator. Control of relative phase in M1 is by means of a parallel-tuned circuit in the collector of Q4.

A two-section R-C lowpass filter in the output of M1 substantially rejects frequency components above about 20 kHz. Operational amplifier U1 functions as a comparator. Positive feedback around U1 causes the comparator transitions to be fast and decisive.

The frequency of operation used, 9 MHz, has a period short compared to the dielectric relaxation time of the antistatic coating used on the rails, so that loss of signal due to partial shielding is minimized. This radio frequency is at the same time well below any self-resonant frequencies encountered in IC's, so that the electrostatic approximation remains valid.

The invention has been described with reference to specific embodiments. Modifications and variations may be employed without departing from the scope of the invention, which is defined in the following claims.

I claim:

1. Integrated circuit counting apparatus comprising plural electrodes, at least one of the electrodes connected to field creating means for creating different fields, at least one other electrode connected to a field receiving means for receiving fields, and count producing means connected to field creating means and field receiving means for producing a count which indicates passing of an integrated circuit near the plural electrodes, wherein the field creating means comprises
   an oscillator,
   a transmitting feed matrix connected to the oscillator, and wherein the plural electrodes comprise
   first and second transmitting electrodes connected to the transmitting feed matrix for out-of-phase excitation of the first and second transmitting electrodes.

2. The apparatus of claim 1 further comprising communicating means for communicating a signal from the oscillator to the count producing means.

3. The apparatus of claim 2 where the communicating means comprises a phase shifter having an input connected to the oscillator and wherein the count producing means comprises a demodulator having inputs connected to the field receiving means and to an output of the phase shifter.

4. The apparatus of claim 3 wherein the count producing means further comprises an adjustable nulling network connected to the oscillator, summation means having inputs connected to the field receiving means and to an output of the nulling network, a band pass amplifier having an input connected to an output of the summation means and having an output connected to the demodulator, a low pass filter having an input connected to the demodulator, and a comparator having an input connected to an output of a low pass filter and having a second input connected to a source of reference voltage, the comparator having an output for connection to a counter.

5. The apparatus of claim 1 wherein one of the electrodes comprise cylindrical electrodes.

6. The apparatus of claim 1 wherein the electrodes comprise cylindrical electrodes aligned on an axis.

7. Integrated circuit counting apparatus comprising plural electrodes, at least one of the electrodes connected to field creating means for creating different fields, at least one other electrode connected to a field receiving means for receiving fields, and count producing means connected to the field creating means and field receiving means for producing a count which indicates passing of an integrated circuit near the plural electrodes, wherein the field creating means creates fields out-of-phase with each other, and wherein the field receiving means includes balanced demodulator means.

* * * * *